(12) United States Patent
Capodivacca et al.

(10) Patent No.: US 7,642,752 B2
(45) Date of Patent: Jan. 5, 2010

(54) METHOD OF DETERMINING A FREQUENCY INTERVAL CONTAINING A RESONANCE FREQUENCY OF A RECHARGEABLE BATTERY

(75) Inventors: Giovanni Capodivacca, Padua (IT); Giorgio Chiozzi, Padua (IT)

(73) Assignee: Infineon Technologies AG, Munich (DE)

(*) Notice: Subject to any disclaimer, the term of this patent is extended or adjusted under 35 U.S.C. 154(b) by 397 days.

(21) Appl. No.: 11/804,737

(22) Filed: May 18, 2007

(65) Prior Publication Data

US 2008/0001576 A1    Jan. 3, 2008

(51) Int. Cl.
*H01M 10/44* (2006.01)
(52) U.S. Cl. ..................................... 320/150
(58) Field of Classification Search .............. 320/107, 320/112, 114, 115, 139, 140, 141, 150
See application file for complete search history.

(56) References Cited

U.S. PATENT DOCUMENTS 3,125,725 A * 3/1964 Chang ..................... 363/159

6,002,238 A    12/1999 Champlin

FOREIGN PATENT DOCUMENTS

RU    2 089 015 C1    8/1997
WO    WO 02/097944 A2    12/2002

\* cited by examiner

*Primary Examiner*—Edward Tso
(74) *Attorney, Agent, or Firm*—Maginot, Moore & Beck

(57) ABSTRACT

Disclosed is a method of determining a resonance frequency interval containing the resonance frequency of a rechargeable battery. The method comprises applying periodic current or voltage signals of different frequencies in succession to a battery cell of the battery. The method also comprises measuring of the temperatures of the battery cell occurring for the different frequencies. In addition, the method comprises comparing of the temperatures, and subsequent selection of an initial frequency of the different frequencies as a first interval value of the resonance frequency interval and a second frequency of the different frequencies as a second interval value of the resonance frequency interval based on the comparison of the temperatures.

18 Claims, 3 Drawing Sheets

METHOD OF DETERMINING A FREQUENCY INTERVAL CONTAINING A RESONANCE FREQUENCY OF A RECHARGEABLE BATTERY

CROSS-REFERENCE TO RELATED APPLICATIONS

This application claims priority from European patent application number 06 011 008.7-1236, filed May 29, 2006.

FIELD

The invention refers to a method for determining a frequency interval that contains a resonance frequency of a rechargeable battery. In at least one embodiment, the rechargeable battery includes a non-fluid electrolyte material.

BACKGROUND

Rechargeable batteries have a so-called internal resonance frequency governed by chemical processes in the battery's interior. It is known that charging processes for supplying the battery with current pulses with a frequency corresponding to the battery's resonance frequency, and thereby ensuring optimum charging. In this connection it is necessary to know the resonance frequency of the battery or to at least know a narrow frequency range within which the resonance frequency lies.

SUMMARY

Disclosed herein is a method of determining a resonance frequency interval including a resonance frequency of a rechargeable battery. The method comprises first applying periodic current or voltage signals of different frequencies in succession to at least one battery cell of the battery. The method further comprises measuring the temperatures of the at least one battery cell occurring for the different frequencies and comparing the temperatures. Thereafter, the method comprises selection of a first frequency of the different frequencies as a first interval value of the resonance frequency interval and a second frequency of the different frequencies as a second interval value of the resonance frequency interval based on the comparison of the temperatures.

BRIEF DESCRIPTION OF THE DRAWINGS

Embodiments of the invention will be explained in greater detail with reference to figures.

DETAILED DESCRIPTION OF THE DRAWINGS

Figure 1:
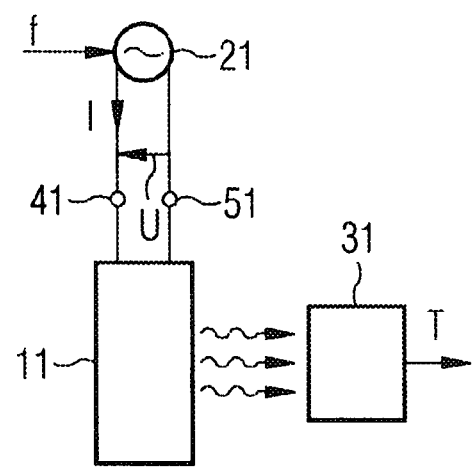
FIG. 1 schematically illustrates a battery cell and a circuit for determining a resonance frequency interval for the cell.

Unless otherwise stated, the reference signs in the figures indicate the same circuit components and signals with the same meaning.

The method according to one embodiment of the invention for determining a frequency interval containing the resonance frequency of a rechargeable battery involves applying a periodic current or voltage signal in succession of time with different frequencies to at least one cell of the battery, and measuring the temperatures that occur at the different frequencies at least at one battery cell. The measured temperatures are compared and, depending on a comparison of these temperatures, an initial frequency of the different frequencies is selected as the first interval value of the resonance frequency interval and a second frequency of the different frequencies is also selected as the second interval value of the resonance frequency interval.

The method makes use of the fact that a cell of a rechargeable battery when applying a periodic current or voltage signal for a specified duration becomes the warmer the more the frequency of the periodic signal deviates from the resonance frequency. The temperature of the battery cell at the end of the period for which the periodic signal is applied is therefore dependent on the frequency of the periodic signal. A curve on which the temperature is imposed on the frequency of the periodic signal exhibits a minimum value for the frequency of the periodic signal corresponding to the resonance frequency. Knowing the temperatures measured for different frequencies this minimum value can be narrowed down.

Any methods that are suitable for determining a minimum value of a function can be applied to find out the frequency for which a minimum temperature value of the battery cell exists.

One of the embodiments of the invention uses the following steps to determine the resonance frequency interval containing the resonance frequency:

a) defining a start frequency interval with a first frequency value and a second frequency value that is larger than the first frequency value, b) defining a first frequency interval within the start frequency interval with a third frequency value and a fourth frequency value, that is larger than the third frequency value, c) applying a periodic current or voltage signal with a frequency matching the third frequency value to a battery cell and measuring a first temperature value for the battery cell, d) applying a periodic current or voltage signal with a frequency matching the third frequency value to a battery cell and determining a second temperature value for the battery cell, e) comparing the first and second temperature values, and select the first frequency and third frequency values as the interval limits of the resonance frequency interval if the second temperature value is larger than the first temperature value, and select the third frequency and second frequency values as the interval limits of the resonance frequency interval if the second temperature value is less than the first temperature value.

The process steps a) to e) can be repeated at least once, wherein prior to repeating the start frequency interval is set to the resonance frequency interval obtained from the previous process step e). The process steps a) to e) can be repeated for a fixed specified number of cycles, or can be repeated any number of times until a terminal condition has been reached. An example of a terminal condition is if the width of the resonance frequency interval is below a specified limit.

FIG. 1 schematically illustrates a battery cell 11 of a rechargeable battery. This battery cell 11 has connection terminals 41, 51 for providing a supply voltage when the battery cell is charged, and which are used during charging to apply a charging voltage to the battery cell 11 or to feed a charging current to the battery cell 11. This charging current may be a periodically alternating current with a frequency that ideally matches an internal resonance frequency of the battery cell 11. The application of a charging current, that varies with this resonance frequency, minimizes the charging losses when charging the battery cell 11.

If a periodic current or voltage signal whose frequency differs from the resonance frequency of the battery cell 11 is applied to the battery cell 11, the battery cell 11 becomes warmer. This warming effect is stronger the greater the frequency of the periodic current or voltage signal U, I deviates from the resonance frequency of the battery cell 11.

To determine a resonance frequency of the battery cell—which, in particular, is a battery cell with a non-fluid electrolyte material—, periodic current or voltage signals with different frequencies are applied to the battery cell 11 in succession using a signal generator 21, and the temperatures of the battery cell 11 resulting from the application of the periodic current or voltage signals are measured. The signal frequency f of the current or voltage signal generated by the signal generator 21 can be adjusted using a control signal. A temperature sensor 31 thermally connected with the battery cell 11 is provided to determine the temperature T of the battery cell 11. The individual signals with different frequencies are applied in succession, for example, each signal for a specified period, at the end of which the temperature of the battery cell 11 is measured. Before applying the periodic signal again (with another frequency to the previous signal), a cooling period is imposed during which the battery cell 11 can cool down before being warmed again by applying the next periodic signal. This cooling period can be a fixed specified time. It is also possible at the beginning of the process to record the ambient temperature and to select the cooling period in each case to be as long as is required for the battery cell 11 to cool down to the ambient temperature. Yet another possibility is to select the cooling period in each case such that the temperature of the battery cell 11 drops during this period by a value according to a specified ratio regarding the previous warming. If the warming of the battery cell 11 in reference to the ambient temperature when applying a periodic signal with a particular frequency has a value C, the cooling period could be selected so that the battery cell 11 cools during the cooling period by a value that is between 50% and 80% of the value C.

Figure 2:
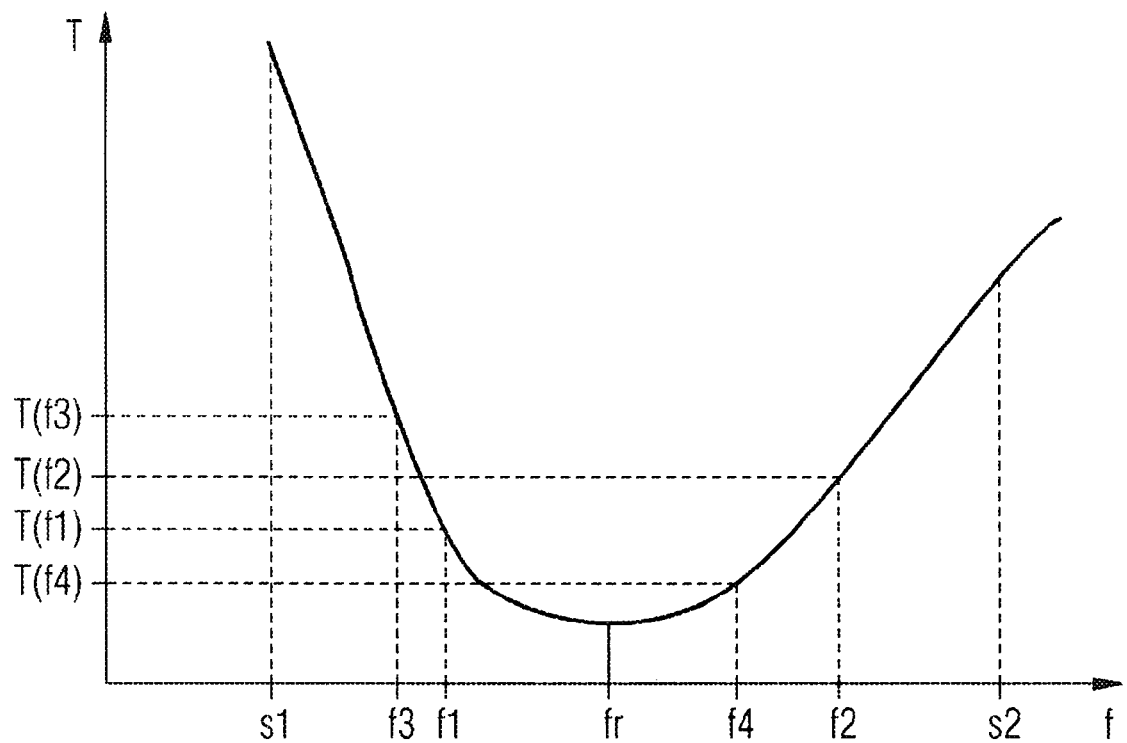
FIG. 2 schematically illustrates the relationship between the frequency of a periodic signal applied for a specified duration to a battery cell and the resulting temperature of the cell.

The dependency of the temperature T of the battery cell 11 on the frequency f of the periodic signal applied to the connection terminals 41, 51 of the battery cell 11 is schematically illustrated in FIG. 2. The function characteristic T(f)—i.e., of the temperature T according to the frequency f, exhibits a minimum value for a frequency value fr, where this frequency value fr corresponds to the resonance frequency of the battery cell 11.

It is desirable to find a relatively small frequency interval within which the resonance frequency fr is located. This frequency interval is referred to from now on as the resonance frequency interval. Note in this context that the resonance frequency interval of a battery cell 11 can be roughly determined on the basis of the design of the battery cell, which means that it is basically known in what interval the resonance frequency is. This interval—which is basically known to include the resonance frequency—is referred to as the start interval [s1, s2] in the following. The so-called start frequency values are indicated in the following by s1 and s2.

Any method may be used to narrow down the resonance frequency interval within this start interval [s1, s2]. It is possible, for example, starting from the first start value s1 to apply consecutive periodic signals with increasing signal frequency to the battery cell 11 and to measure the battery temperature T for each of the signals. The temperature T decreases initially from signal frequency to signal frequency, to then increase for further rises in the signal frequency. The frequency interval between successively applied periodic signals with different frequencies can be specified. The resonance frequency interval can be determined from the series of measured temperatures due to the aspect that the frequency for which the temperature has a minimum value represents an initial interval value of the resonance frequency interval, while the next higher frequency, for which the temperature rises again or has the same value, represents the second interval value of the resonance frequency interval.

The method described above can be used again for the determined resonance frequency interval by selecting a number of frequencies from this resonance frequency interval that, for example, have identical step sizes, and measuring the battery temperatures obtained for these frequencies. The resonance frequency interval can be narrowed down step by step in this way.

The periodic signal can be a periodic signal of any shape, particularly a sinusoidal or rectangular signal.

Methods known from related literature for determining the minimum value of a function are also suitable for use: for example, the golden ratio search or Fibonacci search.

Figure 3:
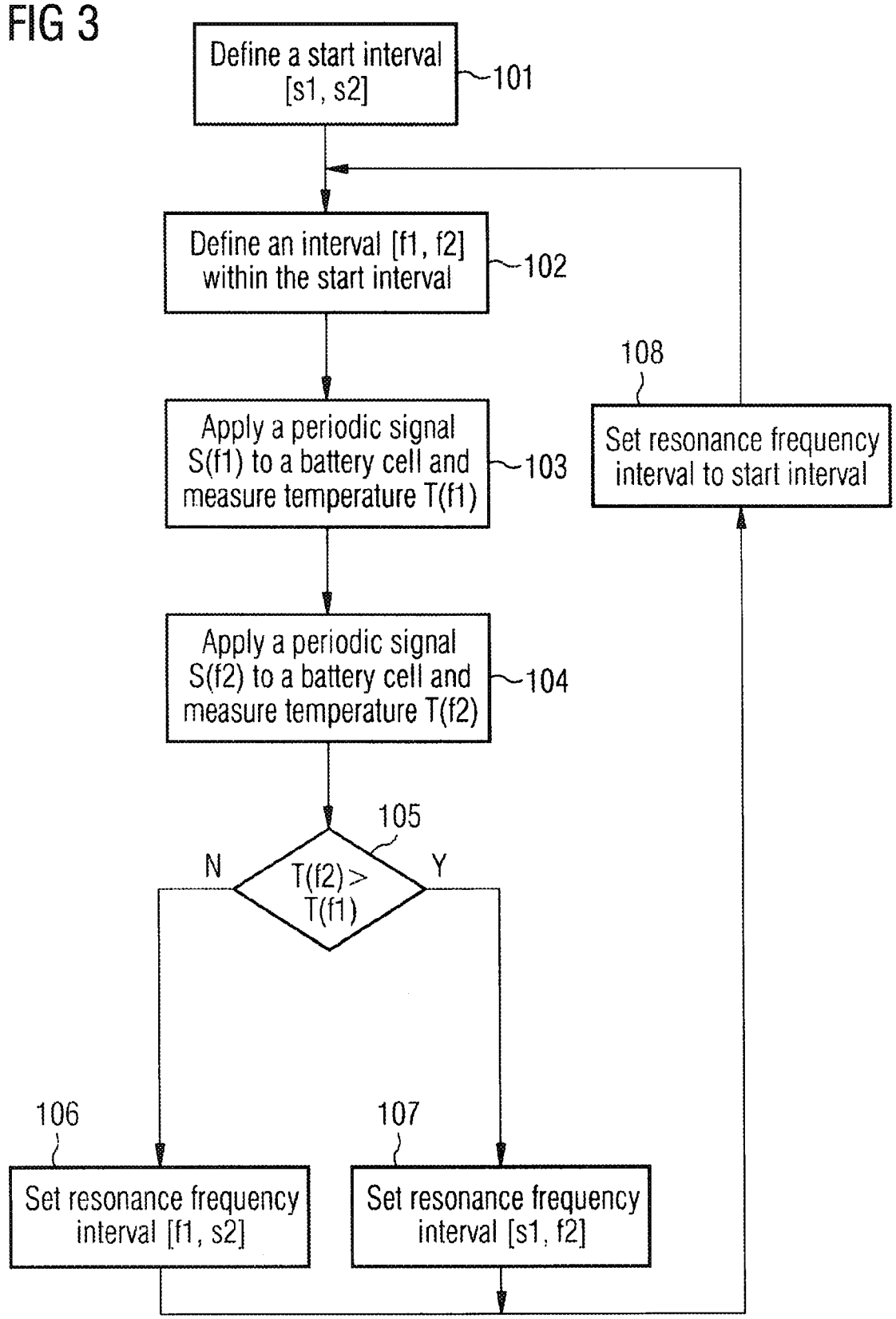
FIG. 3 illustrates individual process steps of an example of the method according to one embodiment of the invention using a flow chart.

A minimum value search function of this kind is explained below using FIG. 2 and the process flow shown in FIG. 3.

The process begins by defining a start interval [s1, s2] in the process step 101. Within this start interval [s1, s2] an initial frequency interval [f1, f2] is defined in the process step 102, where f2>f1. In the process step 103 a periodic signal with the initial frequency f1 of the frequency interval [f1, f2] is applied to the battery cell, and the resulting temperature T(f1) of the battery cell is measured. In the process step 104 a periodic signal with the frequency of the second interval frequency f2 is applied to the battery cell, and the temperature T(f2) of the battery cell resulting from this periodic signal is measured. These two temperatures T(f1), T(f2) are compared in the process step 105, and the resonance frequency interval is defined on the basis of the comparison of these two temperatures. If—as is the case in the example shown—the temperature T(f2) associated with the second frequency f2 is greater than the temperature T(f1) of the first frequency f1, the first start value s1 is selected as the first interval value of the resonance frequency interval, and the second frequency f2 is selected as the second interval value of the resonance frequency interval. The resonance frequency interval is therefore [s1, f2] (process step 106). In the alternative case—if T(f1)>T(f2)—the resonance frequency interval is set to [f1, s2] (process step 107).

The resonance frequency interval is smaller than the start interval [s1, s2] in this case. The described process can be repeated successively a number of times: the previously determined resonance frequency interval is set as the start interval in the process step 108 before cycling through the process again. In the embodiment example shown in FIG. 2, the start interval for another cycle of the process would be the interval [s1, f2]. In a subsequent process step a frequency interval [f3, f4] is determined within the new start interval, and the process steps 102-107 are repeated to further limit the resonance frequency interval.

In the golden ratio search method the interval limits of the resonance frequency interval [f1, f2] are selected within the start interval [s1, s2] in such a way that the following relationships apply:

$$f2 = r(s2-s1) \tag{1a}$$

$$f1 = (1-r) \cdot (s2-s1) \quad (1b)$$

where the following applies to the value r: 0.5<r<1.

In the Fibonacci search method this value r varies as known according to the numbers in the Fibonacci series.

It is assumed in the previously described process when determining the resonance frequency of a battery that only the temperature of one battery cell 11 of the battery is measured. The periodic signals with different frequencies are applied in succession to the battery cell 11.

Figure 4:
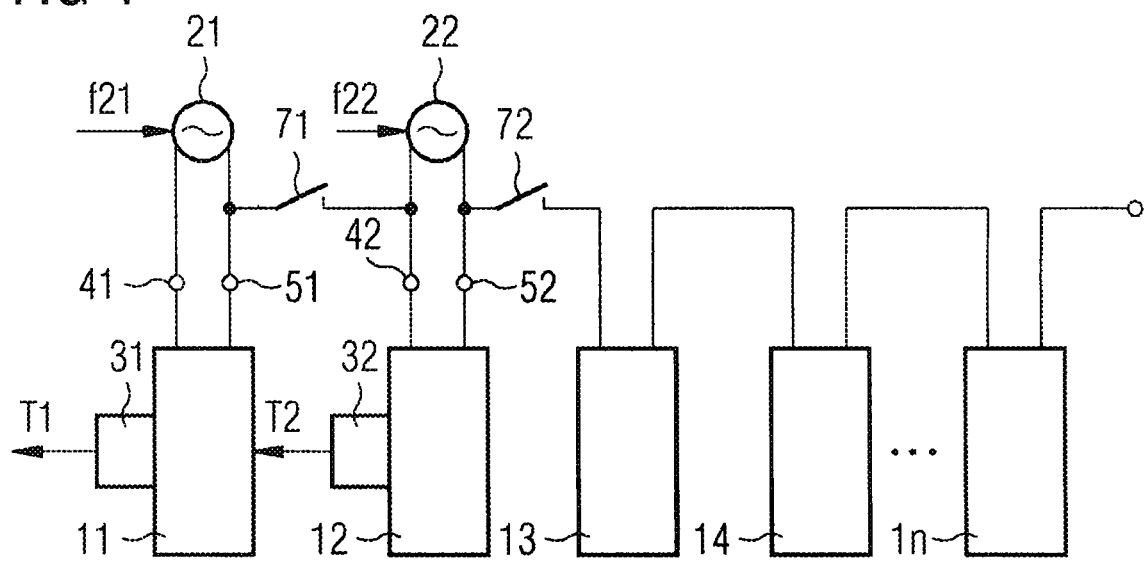
FIG. 4 schematically illustrates a suitable battery with several cells required for implementing the method.

FIG. 4 schematically illustrates a battery with different battery cells 11, 12, 13, 14, 1n. These cells are connected in series during the battery operation. In a variation of the previously explained process periodic signals are to be applied to two battery cells 11, 12 of the battery in order to determine the resonance frequency interval of the battery. It is assumed in this case that the individual battery cells of the battery each have identical resonance frequencies. Applying periodic signals to two battery cells 11, 12 of the battery accelerates the previously described process since the temperature behavior of the battery can be examined for two frequencies at the same time. It is intended, for example, for the described process steps 103, 104 that the periodic signal with the first frequency f1 be applied to an initial battery cell 11 using an initial signal generator 21 and that the periodic signal of the frequency f2 be applied to a second battery cell 22 of the battery using a second signal generator 22.

During the measurement these two battery cells 11, 12 must not be connected to each other or to other battery cells of the battery. Switches 71, 72 are provided for this purpose: they interrupt the series circuit of the two battery cells 11, 12.

Figure 5:
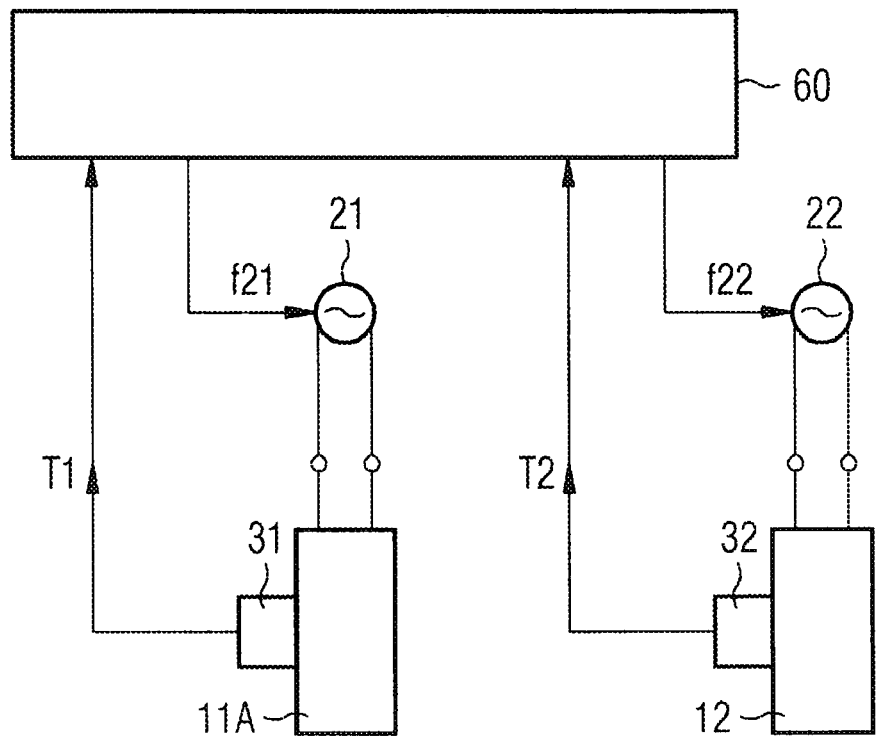
FIG. 5 schematically illustrates another circuit for determining a resonance frequency interval.

In reference to FIG. 5, the previously explained process is controlled by a control circuit 60 that is connected to the signal generators 21, 22 and that outputs the frequency setting signals f21, f22—on which the frequencies of the periodic signals are dependent—to the signal generators 21, 22.

The control circuit 60 is moreover connected to the temperature sensors 31, 32 in order to analyze the temperatures T1, T2 indicated by the temperature sensors, and to set the frequencies of the signal generators 21, 22 for a subsequent iteration step in accordance with the analysis of the temperatures.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is

1. A method of determining a resonance frequency interval containing a resonance frequency of a rechargeable battery, the method comprising:

applying periodic current or voltage signals of different frequencies in succession to at least one battery cell of the battery;

measuring the temperatures of the at least one battery cell occurring for the different frequencies; and comparing the temperatures, and subsequent selection of a first frequency of the different frequencies as a first interval value of the resonance frequency interval and a second frequency of the different frequencies as a second interval value of the resonance frequency interval based on the comparison of the temperatures.

2. The method of claim 1 comprising the steps of:

a) defining a start frequency interval with a first frequency value and a second frequency value that is larger than the first frequency value;

b) defining a first frequency interval within the start frequency interval with a third frequency value and a fourth frequency value that is larger than the third frequency value;

c) applying a periodic current or voltage signal with a frequency matching the third frequency value to the at least one battery cell and measuring a first temperature value for the battery cell;

d) applying a periodic current or voltage signal with a frequency matching the fourth frequency value to the at least one battery cell and measuring a second temperature value for the at least one battery cell;

e) comparing the first and second temperature values, and selecting the first frequency and fourth frequency values as interval limits of the resonance frequency interval if the second temperature value is larger than the first temperature value, and selecting the third frequency and second frequency values as the interval limits of the resonance frequency interval if the second temperature value is less than the first temperature value.

3. The method of claim 2 wherein the steps a) to e) are repeated at least once, wherein prior to a repetition the start frequency interval is set to the same resonance frequency interval obtained from the previous step e).

4. The method of claim 3 wherein a specified period is waited before repeating the steps a) to e).

5. The method of claim 2 wherein the first frequency interval is selected such that a distance between the fourth frequency value and the first frequency value is r times the interval width of the first start interval, and a distance between the third frequency value and the first frequency value is (1−r) times the interval width of the first start interval, where 0.5<r<1.

6. The method of claim 2 wherein the steps a) to e) are repeated for a fixed specified number.

7. The method of claim 2 wherein the steps a) to e) are repeated in succession until an interval width of the resonance frequency interval determined in step e) is below a specified value.

8. The method of claim 2 wherein the at least one battery cell comprises at least two battery cells and wherein the periodic signal in the process step c) is applied to a first battery cell and the periodic signal in the process step d) to a second battery cell.

9. A method of determining a resonance frequency interval containing a resonance frequency of a rechargeable battery, the method comprising:

a) applying a first signal of a first frequency to at least one battery cell of the battery;

b) applying a second signal of a second frequency to the at least one battery cell of the battery, the second frequency different than the first frequency;

c) measuring a first temperature of the at least one battery cell after the first signal is applied to the at least one battery cell;

d) measuring a second temperature of the at least one battery cell after the second signal is applied to the at least one battery cell;

e) comparing the first temperature and the second temperature; and f) selecting a resonance frequency interval based on the comparison of the first temperature and the second temperature.

10. The method of claim 9 further comprising the step of defining a start interval with a first start frequency value and a second start frequency value that is larger than the first start frequency value.

11. The method of claim 10 wherein the first frequency and the second frequency define a frequency interval within the start interval.

12. The method of claim 11 wherein the step of selecting a resonance frequency interval comprises selecting the first start frequency value and the second frequency as interval limits of the resonance frequency interval if the second temperature is larger than the first temperature, and selecting the first frequency and the second start frequency value as the interval limits of the resonance frequency interval if the second temperature is less than the first temperature.

13. The method of claim 12 wherein the steps a) to f) are repeated at least once, wherein prior to a repetition the start interval is set to the selected resonance frequency interval.

14. The method of claim 13 wherein a specified period is waited prior to a repetition of steps a) to f).

15. The method of claim 13 wherein the steps a) to f) are repeated for a predetermined number of times.

16. The method of claim 13 wherein the steps a) to f) are repeated in succession until an interval width of the resonance frequency interval is below a specified value.

17. The method of claim 10 wherein the second frequency is equal to r times the difference between the second start frequency value and the first start frequency value, and the first frequency is equal to (1−r) times the difference between the second start frequency value and the first start frequency value, wherein $0.5 < r < 1$.

18. The method of claim 9 wherein the at least one battery cell comprises a first battery cell and a second battery cell and wherein the first signal is applied to the first battery cell and the second signal is applied to the second battery cell.

* * * * *